US012763286B2

(12) United States Patent
Bae et al.

(10) Patent No.: US 12,763,286 B2
(45) Date of Patent: Oct. 13, 2026

(54) PECVD TRENCH BOTTOM PROFILE CONTROL WITH PULSED DUAL RF PLASMA

(71) Applicant: Applied Materials, Inc., Santa Clara, CA (US)

(72) Inventors: John Bae, San Jose, CA (US); Weiting Tseng, San Jose, CA (US); Praket Prakash Jha, San Jose, CA (US); Jingmei Liang, San Jose, CA (US); Xiang Ji, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 18/674,296

(22) Filed: May 24, 2024

(65) Prior Publication Data

US 2025/0364210 A1 Nov. 27, 2025

(51) Int. Cl.

| | |
|---|---|
| ***H01J 37/32*** | (2006.01) |
| ***C23C 16/515*** | (2006.01) |
| ***C23C 16/56*** | (2006.01) |
| ***H10P 14/60*** | (2026.01) |
| ***H10P 50/28*** | (2026.01) |

(52) U.S. Cl.

CPC ...... *H01J 37/32146* (2013.01); *C23C 16/515* (2013.01); *C23C 16/56* (2013.01); *H01J 37/32449* (2013.01); *H10P 14/6336* (2026.01); *H10P 14/6339* (2026.01); *H10P 50/283* (2026.01); *H01J 2237/3321* (2013.01); *H01J 2237/334* (2013.01); *H01J 2237/3387* (2013.01)

(58) Field of Classification Search

None

See application file for complete search history.

(56) References Cited

U.S. PATENT DOCUMENTS 7,303,999 B1 12/2007 Sriraman et al.
2009/0004873 A1 * 1/2009 Yang ................ H01J 37/32165 156/345.48

(Continued)

FOREIGN PATENT DOCUMENTS

KR 101708936 B1 2/2017
WO 2023-076524 A1 5/2023

OTHER PUBLICATIONS

International Search Report and Written Opinion for PCT/US2025/030541 Dated Sep. 3, 2025.

*Primary Examiner* — Shamim Ahmed

(74) *Attorney, Agent, or Firm* — Patterson + Sheridan, LLP

(57) ABSTRACT

Embodiments of the present disclosure relate to an apparatus and method utilized in the manufacture of semiconductor devices. In one embodiment, a method of forming a layer, including positioning a substrate in a processing chamber; introducing at least one precursor gas into the processing chamber; generating a dual RF plasma with the at least one precursor gas by pulsing a first RF power source and a second RF power source, the first RF power source and the second RF power source having different frequencies; depositing a layer on the substrate with the dual RF plasma; introducing at least one additional precursor gas into the processing chamber; generating an etching plasma by applying the first RF power source to the at least one additional precursor gas; and etching the layer with the etching plasma.

19 Claims, 4 Drawing Sheets

(56) References Cited

U.S. PATENT DOCUMENTS

| | | | |
|---|---|---|---|
| 2016/0020092 | A1 | 1/2016 | Kang et al. |
| 2018/0061628 | A1* | 3/2018 | Ou ...................... H10P 14/6339 |
| 2019/0382897 | A1 | 12/2019 | Tabata |
| 2023/0377855 | A1 | 11/2023 | Chitradurga et al. |
| 2024/0162042 | A1* | 5/2024 | Guo ...................... H10P 50/244 |
| 2025/0273431 | A1* | 8/2025 | Alaydrus .......... H01J 37/32146 |

* cited by examiner

PECVD TRENCH BOTTOM PROFILE CONTROL WITH PULSED DUAL RF PLASMA

BACKGROUND

Field

Embodiments of the present invention generally relate to the fabrication of integrated circuits and, more particularly, to the deposition on an amorphous layer containing silicon on a semiconductor substrate.

Description of the Related Art

Integrated circuits have evolved into complex devices that can include millions of transistors, capacitors, and resistors on a single chip. The evolution of chip design continually requires faster circuitry and greater circuit density. The demand for faster circuits with greater circuit densities imposes corresponding demands on the fabrication methods and materials used to fabricate such integrated circuits. In particular, as the dimensions of integrated circuit components are reduced to sub-micron dimensions, it has been necessary to ensure that the various materials (e.g., conductive materials) are deposited evenly and uniformly across the semiconductor substrate.

Producing devices with surface defects or feature deformation is problematic. Often, structure trenches include unique features, such as undercuts located at the bottom of a trench profile. Such features may be out of the line-of-sight for incoming depositing species, making it difficult to reliably fill the features when depositing a film. Previously, depositing a film in trenches having undercuts without the presence of film seams or void in the undercut region was possible only with the use of a separate etch chamber or by implementing plasma conditions that were unfavorable to overall film properties.

Thus, there is a need in the art for improved methods and apparatus for tuning trench bottom deposition profiles.

SUMMARY

Embodiments of the present disclosure generally relate to systems and methods used in the manufacture of semiconductor devices. More particularly, embodiments of the present disclosure relate to a method of controlling trench bottom deposition profiles and a substrate processing chamber and components thereof for the same. In one embodiment, a method of forming a layer, including positioning a substrate in a processing chamber; introducing at least one precursor gas into the processing chamber; generating a dual RF plasma with the at least one precursor gas by pulsing a first RF power source and a second RF power source, the first RF power source and the second RF power source having different frequencies; depositing a layer on the substrate with the dual RF plasma; introducing at least one additional precursor gas into the processing chamber; generating an etching plasma by applying the first RF power source to the at least one additional precursor gas; and etching the layer with the etching plasma.

In another embodiment, a substrate processing method, including forming a layer containing silicon on a substrate surface, the substrate surface having at least one feature thereon, the at least one feature extending a feature depth from the substrate surface to a bottom surface, the bottom surface having a convex shape, the at least one feature having a width defined by a first sidewall and a second sidewall, where the layer containing silicon is deposited on the substrate surface, the first sidewall, the second sidewall, and the bottom surface of the at least one feature by generating a dual radiofrequency (RF) plasma, wherein generating the dual RF plasma comprises synchronously pulsing a first RF power source and a second RF power source.

In yet another embodiment, a non-transitory computer readable medium including instructions, that, when executed by a controller of a processing chamber, cause the processing chamber to perform operations, includes positioning a substrate in a processing chamber; introducing the at least one precursor gas into the processing chamber; generating the dual RF plasma with the at least one precursor gas by pulsing the first RF power source and the second RF power source, the first RF power source and the second RF power source having different frequencies; depositing the layer on the substrate with the dual RF plasma; introducing the at least one additional precursor gas into the processing chamber; generating the etching plasma by applying the first RF power source to the at least one additional precursor gas; and etching the layer with the etching plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to an apparatus and method utilized in the manufacture of semiconductor devices. By modulating the ion-to-radical ratio, ion energy distribution, and/or ion angular distribution during a deposition process, the bottom profile of a trench can be tuned and controlled. Modulation of the ion-to-radical ratio, ion energy distribution, and/or ion angular distribution can be accomplished in part by generating a low frequency radiofrequency (RF) plasma. The low frequency RF plasma increases ion energy, which in turn narrows the ion angular distribution function, causing greater etching and sputtering of trench bottoms. Further, pulsing of a dual RF frequency plasma at a low frequency and high frequency allows for greater radical contribution to the deposition process during plasma off-times. Tuning the pulsing parameters allows for the toggling of ion versus radical contribution to the deposition process. Thus, tuning the pulsing parameters increases the deposition rate in non-line-of-sight features (e.g., undercuts and bottom profiles of the trench) and enables shape control (e.g., convex to concave) of the bottom profile of the trench. It is contemplated that other processing chambers and/or processing platforms, including those from other manufacturers, may be adapted to benefit from aspects of the disclosure.

Figure 1:
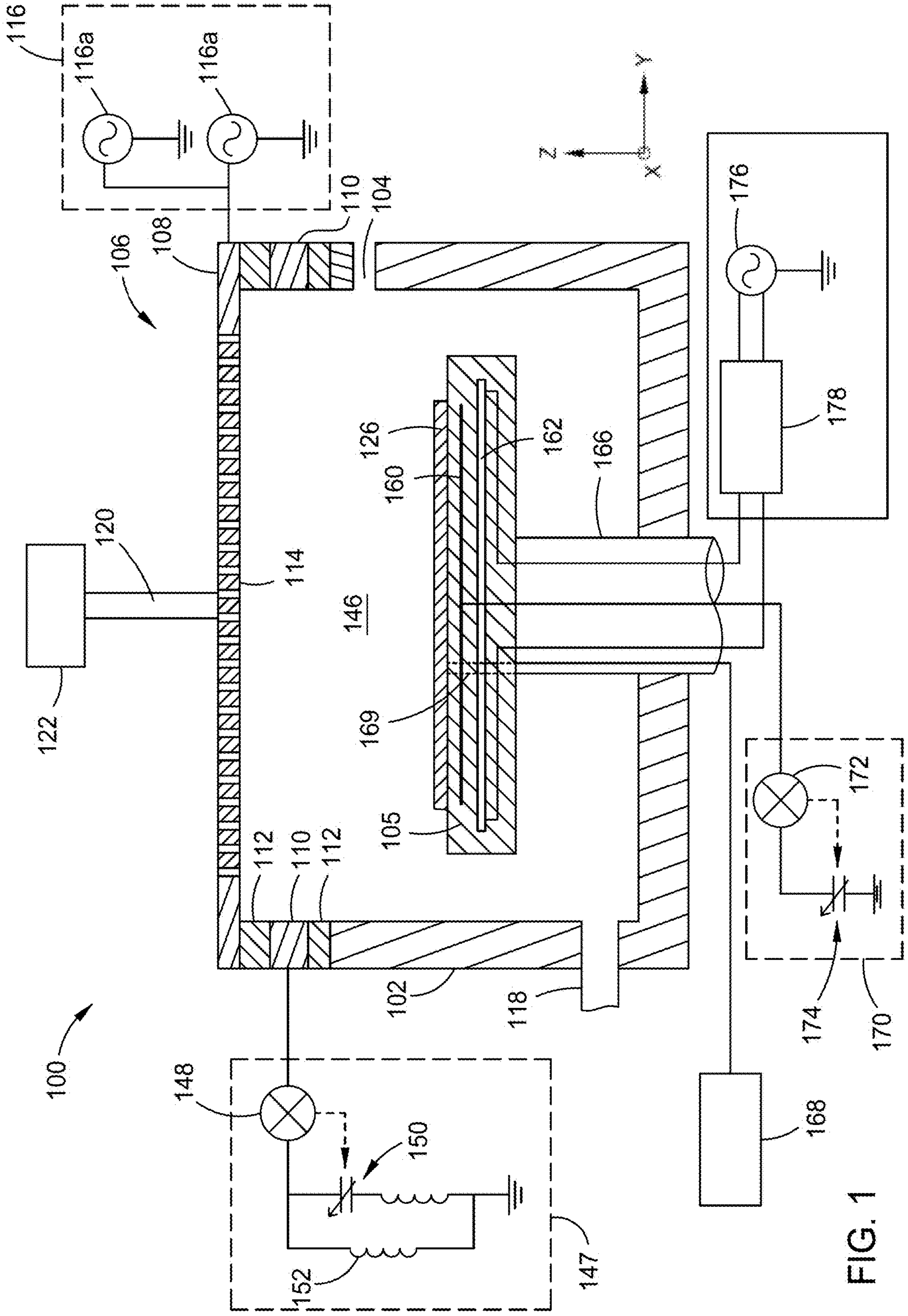
FIG. 1 is a schematic cross-sectional view of a process chamber, according to certain embodiments.

FIG. 1 is a schematic cross sectional view of a process chamber 100 configured according to various embodiments of the present disclosure. By way of example, the embodiment of the process chamber 100 in FIG. 1 is described in terms of a PECVD system, but any other process chamber may fall within the scope of the embodiments, including other plasma deposition chambers or plasma etch chambers. The process chamber 100 includes a chamber body 102, a lid assembly 106, and a substrate support 105. The lid assembly 106 is disposed at an upper end of and is supported by the chamber body 102, and the substrate support 105 is at least partially disposed within the chamber body 102. The chamber body 102, lid assembly 106, and substrate support 105 together define a processing volume 146 within the process chamber 100 in which a substrate 126 may be processed. The processing volume 146 may be accessed through a port 104 formed in the chamber body 102 that facilitates transfer of a substrate into and out of the processing volume 146 of the process chamber 100.

The lid assembly 106 includes a gas distributor 108, a modulation electrode 110, and insulators 112. In some embodiments, the modulation electrode 110 is optional. The insulator 112, which may be a dielectric material such as a ceramic or metal oxide, for example aluminum oxide and/or aluminum nitride. The insulator 112 contacts the modulation electrode 110 and separates the modulation electrode 110 electrically and thermally from the gas distributor 108 and from the chamber body 102. The gas distributor 108 (e.g., showerhead) has passages 114 therethrough for admitting process gas into the processing volume 146. A pair of insulators (e.g., annular insulators) are disposed between the gas distributor 108 and the modulation electrode 110. The modulation electrode 110 is annular and circumscribes the processing volume 146.

Process gases (e.g., one or more precursor and/or one or more inert carrier gas) may be provided through the conduit 120 from a gas source 168 to be introduced into the process chamber 100. The processing gas from the conduit 120 enters the processing volume 146 through the passages 114 in the gas distributor 108 such that the processing gas is uniformly distributed in the processing volume 146. In one embodiment, the passages 114 in the gas distributor 108 may be radially distributed and gas flow to each of the passages 114 may be separately controlled to further facilitate gas uniformity within the processing volume 146. In some embodiments, the processing gases (e.g. one or more precursor and/or one or more inert carrier gas) includes carbon containing gases, hydrogen containing gases, silicon containing gases (e.g., $SiH_4$), Argon (Ar), and helium, among others, for example $C_2H_2$. In some embodiments, which can be combined with other embodiments described herein, a total flow rate of precursor gases into the processing volume 146 is about 10 standard cubic centimeter per minute (sccm) to about 3 standard litre per minute (slm). In some embodiments, which can be combined with other embodiments described herein, $C_2H_2$ is provided at a flow rate of about 10 sccm to about 1,000 sccm and He is provided at a flow rate of about 50 sccm to about 5,000 sccm. In some embodiments, a hydrogen containing gas is provided at a flow rate of about 500 sccm to about 2.5 slm. In some embodiments, a silicon containing gas (e.g. SiC, SiCN, SiN, and SiCON) is provided at a flow rate of about 10 sccm to about 200 sccm. In some embodiments, a nitrogen containing gas is provided at a flow rate of about 2.5 slm The processing gases can be evacuated from the processing volume 146 through an outlet 118 which may be located at any convenient location along the chamber body 102. In some embodiments, the outlet 118 may be associated with a vacuum pump (not shown) fluidly coupled to the processing volume 146. The vacuum pump may be part of the gas and pressure control system of the processing chamber 100. In some embodiments, the vacuum pump is a roughing pump.

In some embodiments, portions of the gas distributor 108 may be heated using a resistive heater (not shown) or thermal fluid disposed in a conduit (not shown) through a portion of the gas distributor 108 or otherwise in direct contact or thermal contact with the gas distributor 108. The conduit may be disposed through an edge portion of the gas distributor 108 to avoid disturbing the gas flow function of the gas distributor 108. Heating the edge portion of the gas distributor 108 may be useful to reduce the tendency of the edge portion of the gas distributor 108 to be a heatsink within the process chamber 100.

In some embodiments, the walls of the chamber body 102 may also be heated to similar effect. Heating the chamber surfaces exposed to the plasma also minimizes deposition, condensation, and/or reverse sublimation on the chamber surfaces, reducing the cleaning frequency of the chamber and increasing mean cycles per clean. Higher temperature surfaces also promote dense deposition that is less likely to produce particles that fall onto a substrate. Thermal control conduits with resistive heaters and/or thermal fluids (not shown) may be disposed through the chamber walls to achieve thermal control of the chamber walls. Temperature of all surfaces may be controlled by a controller.

In some embodiments, the gas distributor 108 may be coupled to a RF power source 116, such as a RF generator, as shown in FIG. 1. DC power, pulsed DC power, and pulsed RF power source may alternatively be used. In other embodiments, the gas distributor 108 may be coupled to ground. The RF power source 116 is electrically connected to the gas distributor 108 and is configured to apply a RF potential to the gas distributor 108 to facilitate the generation of plasma in the interior processing volume 146. In some embodiments, the RF power source 116 may be a high frequency RF power source ("HFRF power source") capable of generating an HFRF power (e.g., at a frequency of about 10 MHz to about 40 MHz, e.g., about 20 MHz to about 22 MHz, about 22 MHz to about 24 MHz, about 24 MHz to about 26 MHz, about 26 MHz to about 28 MHz, or about 28 MHz to about 30 MHz). The HFRF power source can be designed for use with a fixed match and can regulate the power delivered to the load, eliminating concerns about forward and reflected power. Without being bound by theory, an HFRF power source of about 26 MHz to about 28 MHz can provide an increase in the $C_2H$ production rate and H production rate, thereby producing a more conformal and/or uniform carbon gapfill in trenches between one or more features, and reducing pattern loading effects. The HFRF power enables increased radical flux during generation of the plasma in the interior processing volume 146, while also enabling a decrease in the pressure in the processing volume. An overall increase in power enables an overall increase in flux. An increase in the power and an increase in pressure enables in an increase in radical flux.

In other embodiments, the RF power source 116 may be a low frequency RF power source ("LFRF power source") capable of generating an LFRF power (e.g., at a frequency of about 350 kHz). The LFRF power source can provide both low frequency generation and fixed match elements. The LFRF, in combination with higher pressure, enables increased radical flux during the generation of the plasma in the interior processing volume 146.

In further embodiments, an additional power source may be added with the RF power source 116 to provide a dual RF power source to the process chamber 100. In some embodiments, the RF power source 116 is a dual RF power source comprising a first RF power source **116*a* and a second RF power source 116*b*. In some embodiments, the first RF power 116*a* is a top-fed medium to high frequency RF power source, for example, about 13.56 MHz to about 80 MHz, such as about 13.56 MHz to about 40 MHz, such as about 13.56 MHz to about 27 MHz, such as 27 MHz. The second RF power source 116*b* is a top-fed low or medium frequency RF power source, for example, about 350 kHz to about 2 MHz, such as 350 kHz. In some embodiments, the first RF power source 116*a* provides a first power of about 200 W to about 5 KW, such as about 700 W to about 3 KW, such as about 1 KW to about 3 KW. The second RF power source 116*b* provides a second power of about 1000 W to about 6 KW, such as about 1500 W to about 4 KW. In some embodiments, the RF power source 116 implements a matching network (not shown), electrically coupled to gas distributor 108, to enable proper impedance matching between the dual RF power sources 116*a*, 116*b* and gas distributor 108**.

The modulation electrode 110 may be coupled to an optional tuning circuit 147 that controls an impedance of an electrical path from the modulation electrode 110 to an electrical ground. The tuning circuit 147 comprises an electronic sensor 148 and an electronic controller, which may be a variable capacitor 150 as shown that is controllable by the electronic sensor 148. The tuning circuit 147 may be an LLC circuit comprising one or more inductors 152. The electronic sensor 148 may be a voltage or current sensor and may be coupled to the variable capacitor 150 to afford a degree of closed-loop control of plasma conditions inside the processing volume 146. In some embodiments, the tuning circuit 147 may be any circuit that features a variable or controllable impedance under the plasma conditions present in the processing volume 146 during processing. In specific examples where the optional tuning circuit 147 is not implemented, the optional tuning circuit 147 is not coupled to the modulation electrode 110.

The substrate support 105 may be disposed within the process chamber 100. The substrate support 105 may support the substrate 126 during processing. A first electrode 160 and an optional second electrode 162 are disposed in and/or on the substrate support 105. Further, in some embodiments, a heater element (not shown) may be embedded in the substrate support 105. The heater element can be operable to controllably heat the substrate support 105 and the substrate 126 positioned thereon to a target temperature, such as to maintain the substrate 126 at a temperature in a range from about 300 degrees Celsius to about 550 degrees Celsius.

The substrate support 105 is coupled to a shaft 166 for support. The shaft 166 can provide a conduit from a gas source 168 and electrical and temperature monitoring leads (not shown) between the substrate support 105 and other components of the process chamber 100. In some examples, a purge gas may be provided from the gas source 168 to the backside of the substrate 126 through one or more purge gas inlets 169 connected to the substrate support 105. The purge gas flowed toward the backside of the substrate 126 can help prevent particle contamination caused by deposition on the backside of the substrate 126. The purge gas may also be used as a form of temperature control to cool the backside of the substrate 126. Although not illustrated, the shaft 166 may be coupled to an actuator (not shown) which extends through a centrally-located opening formed in a bottom of the chamber body 102. The actuator may be flexibly sealed to the chamber body 102 by bellows (not shown) that prevent vacuum leakage from around the shaft 166. The actuator can allow the substrate support 105 to be moved vertically within the chamber body 102 between a process position and a lower, transfer position. The transfer position is slightly below the port 104 in the chamber body 102. In operation, the substrate support 105 may be elevated to a position in close proximity to the lid assembly 106 for processing.

The first electrode 160 may be embedded within the substrate support 105 or coupled to a surface of the substrate support 105. The first electrode 160 may be a plate, a perforated plate, a mesh, a wire screen, or any other distributed arrangement. The first electrode 160 may be a tuning electrode and may be coupled to a tuning circuit 170. The tuning circuit 170 may have an electronic sensor 172 and an electronic controller, such as a capacitor 174 (e.g. a fixed or variable capacitor) electrically connected between the first electrode 160 and an electrical ground. In certain embodiments, capacitor 174 is fixed. The electronic sensor 172 may be a voltage or current sensor and may be coupled to the capacitor 174 to provide further control over plasma conditions in the processing volume 146.

The optional second electrode 162, which may be a bias electrode and/or an electrostatic chucking electrode, may be coupled to the substrate support 105. The second electrode 162 may be coupled to a bias power source 176 through an impedance matching circuit 178. The bias power source 176 may be DC power, pulsed DC power, RF power, pulsed RF power, or a combination thereof (e.g., pulsing HFRF or continuous wave HFRF). In specific examples where the optional second electrode 162 is not implemented, the second electrode 162 is not coupled to the substrate support 105.

In operation, the substrate 126 is disposed on the substrate support 105, and process gases are flowed through the lid assembly 106 according to any desired flow plan. Electric power is coupled to the gas distributor to establish a plasma in the processing volume 146. The substrate 126 may be subjected to an electrical bias using the bias power source 176, if desired.

Upon energizing a plasma in the processing volume 146, a potential difference is established between the plasma and the modulation electrode 110. A potential difference is also established between the plasma and the first electrode 160. Capacitor 174 may then be used to adjust the impedances of the paths to an electrical ground, represented by the tuning circuit 170. In some embodiments, optional capacitor 150 may be used with capacitor 174 to adjust the impedances of the paths to an electrical ground, represented by tuning circuit 147 (optional) and tuning circuit 170. A set point may be delivered to the tuning circuit 147 (optional) and 170 to provide independent control of the plasma density uniformity from center to edge and deposition rate. The electronic sensors may adjust the variable capacitors to maximize deposition rate and minimize thickness non-uniformity independently. The components implemented to control temperature and uniformity of the plasma, among other, can permit deposition of a highly conformal layer on a substrate being processed, even within small gaps.

Figure 2:
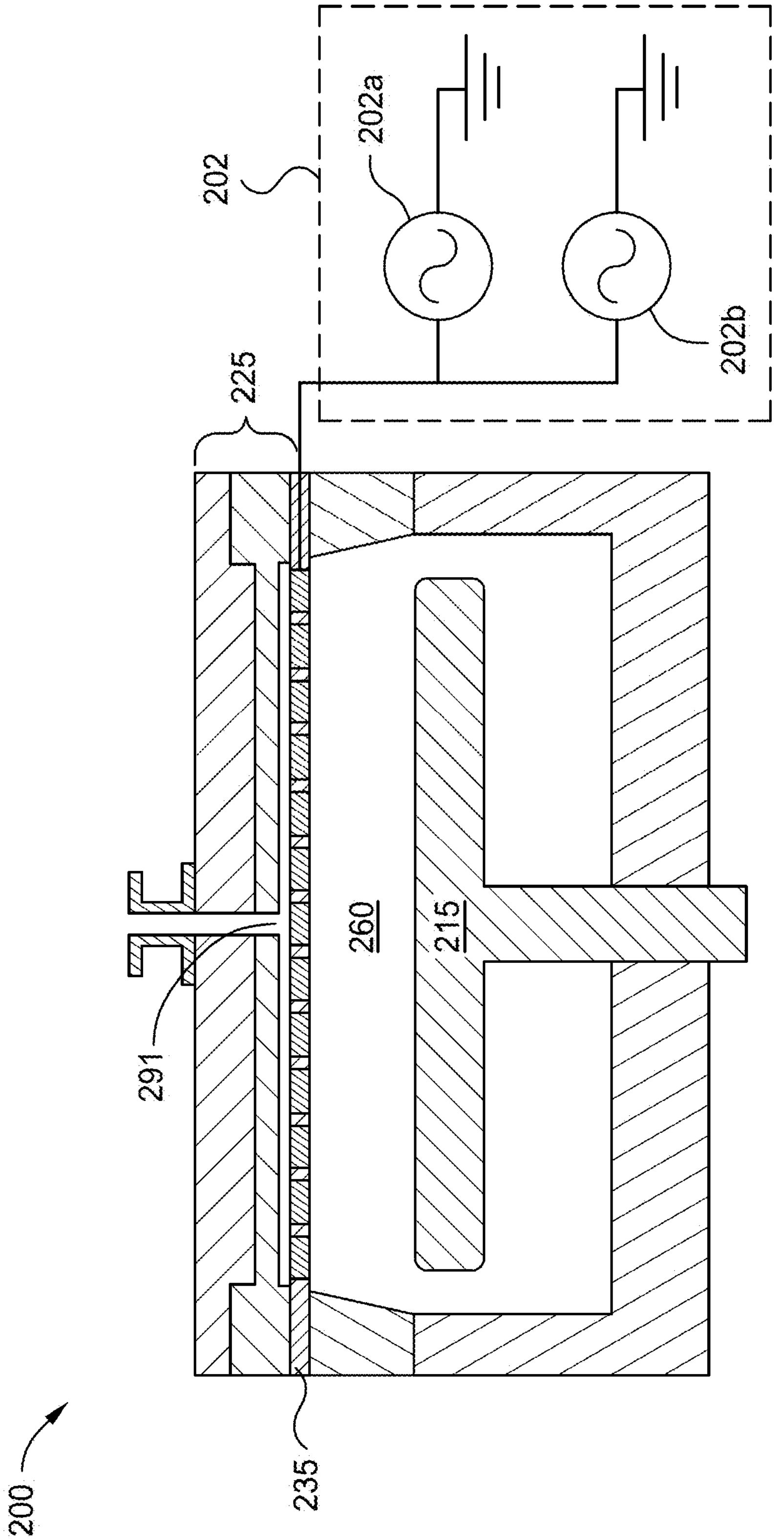
FIG. 2 depicts a schematic side cross sectional view of a process chamber according to one or more embodiments.

FIG. 2 is a schematic cross sectional view of a processing chamber, according to one or more embodiments. Processing chamber 200 includes the lid assembly 225, processing volume 260, and substrate support 215, and further includes a gas distributor 235 and a dual RF frequency power source 202. The processing chamber 200 may be, correspond to, or be a part of, the processing chamber 100 described in FIG. 1. As such, the lid assembly 225 may be the lid assembly 106, the processing volume 260 may be the processing volume 146, substrate support 215 may be substrate support 105, gas distributor 235 (e.g., showerhead) may be gas distributor 108, and dual RF frequency power source 202 may be RF power source 116.

Dual RF frequency power source 202 is coupled to gas distributor 235 and includes a first RF power source 202*a* (e.g., first RF power source 116*a*) and a second RF power source 202*b* (e.g., second RF power source 116*b*). Gas distributor 235 is coupled to the lid assembly 106 and located above the substrate support 215 in the process volume 260. The gas distributor 235 is configured to introduce one or more precursor gases into the process volume 260 of the processing chamber 200. The gas distributor 235 also functions as an electrode for coupling the dual RF frequency power source 202 to the process gases introduced into the process volume 260. The dual RF frequency power source 202 is coupled to the gas distributor 235. The dual RF frequency power source 202 is configured to provide the power necessary for striking and sustaining the plasma formed (not shown) from the gases within the process volume 260. The operation of the dual RF frequency power source 202 is controlled by a controller (e.g. controller 194 of FIG. 1) in the processing chamber 200. Precursor gases, such as hydrogen containing gases and silicon containing gases, flow through one or more channels 291, then through the gas distributor 235 and into the process volume 260. In some embodiments, other gases used during deposition process 300, described below, also flow through one or more channels 291, the through the gas distributor 235 and into the process volume 260 (e.g., etching gases and nitrogen containing gases). The total flow rate of precursor gases into the processing volume 260 is about 1000 sccm to about 10000 sccm.

The dual RF frequency power source 202 facilitates maintenance or generation of plasma, such as a plasma generated from precursor gases. The precursor gases are ionized into a plasma in situ via the dual frequency RF power source 202. The first RF power source 202*a* is a top-fed medium to high frequency RF power source, for example, about 13.56 MHz to about 80 MHz, such as about 13.56 MHz to about 40 MHz, such as about 13.56 MHz to about 27 MHz, such as 27 MHz. The second RF power source 202*b* is a top-fed low or medium frequency RF power source, for example, about 350 kHz to about 2 MHz, such as 350 kHz. Use of a top-fed dual RF frequency power source (e.g., dual RF frequency power source 202) for deposition also improves film quality on the substrate. In some embodiments, the frequency provided to the first RF power source 202*a* and the second RF power source 202*b* may be synchronously pulsed (i.e., pulsed at the same time). In other embodiments, the first RF power source 202*a* and the second RF power source 202*b* are asynchronously pulsed (e.g., pulsed with time delay). In yet another embodiment, the first RF power source 202*a* and the second RF power source 202*b* provide power in a continuous wave. During the deposition process, the first RF power source 202*a* provides a first power less than 3 kW, such as between a range of about 50 W to about 1500 W. The second RF power source 202*b* provides a second power less than 1.5 kW, such as between a range of about 15 W to about 500 W. In some embodiments, the dual RF frequency power source 202 implements a matching network (not shown), electrically coupled to gas distributor 235, to enable proper impedance matching between the dual RF power sources 202*a*, 202*b* and gas distributor 235.

Figure 3:
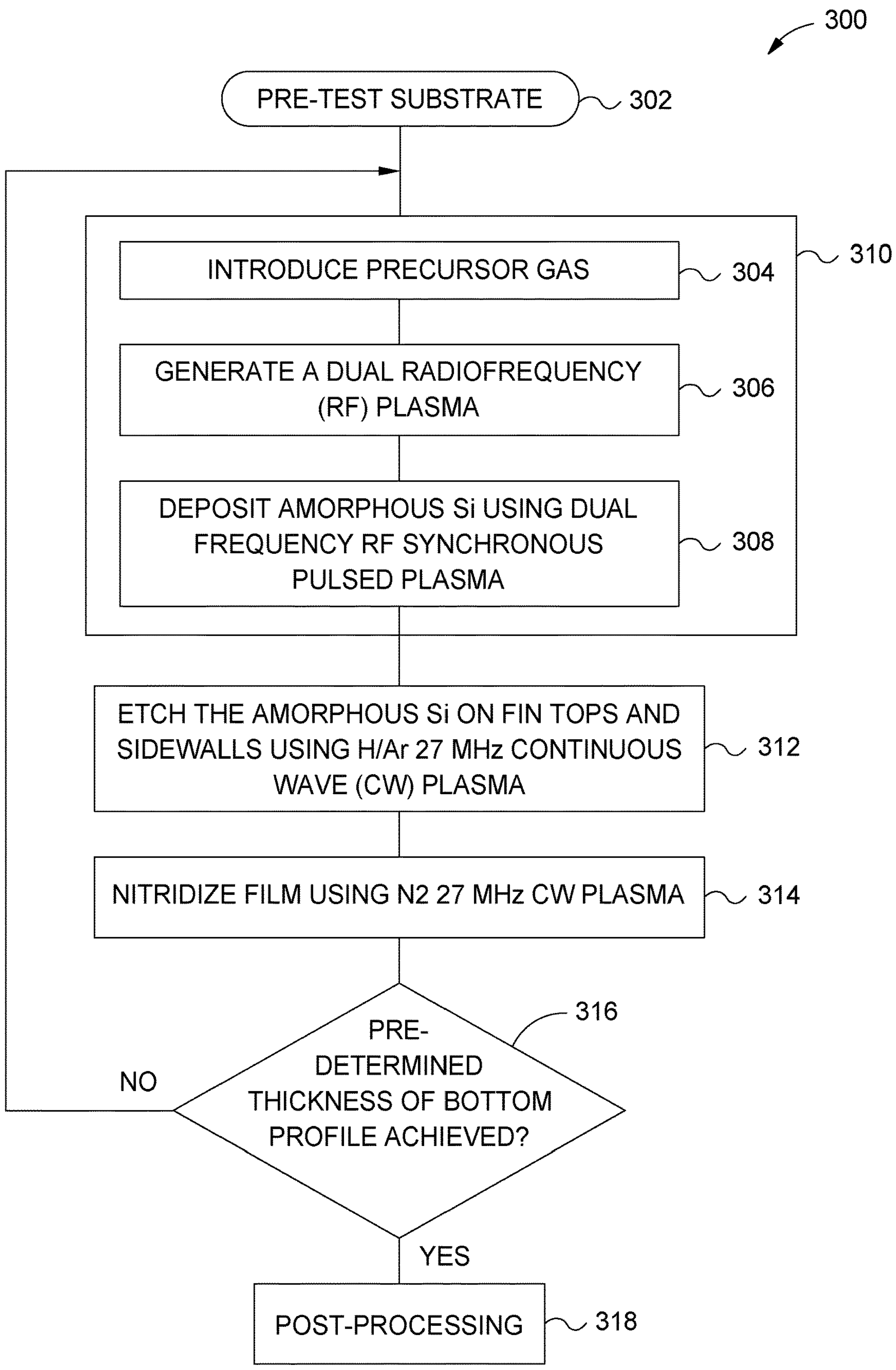
FIG. 3 illustrates a flowchart of a method for depositing a film via dual frequency radiofrequency (RF) synchronous pulsed plasma according to one or more embodiments.
Figure 4B:
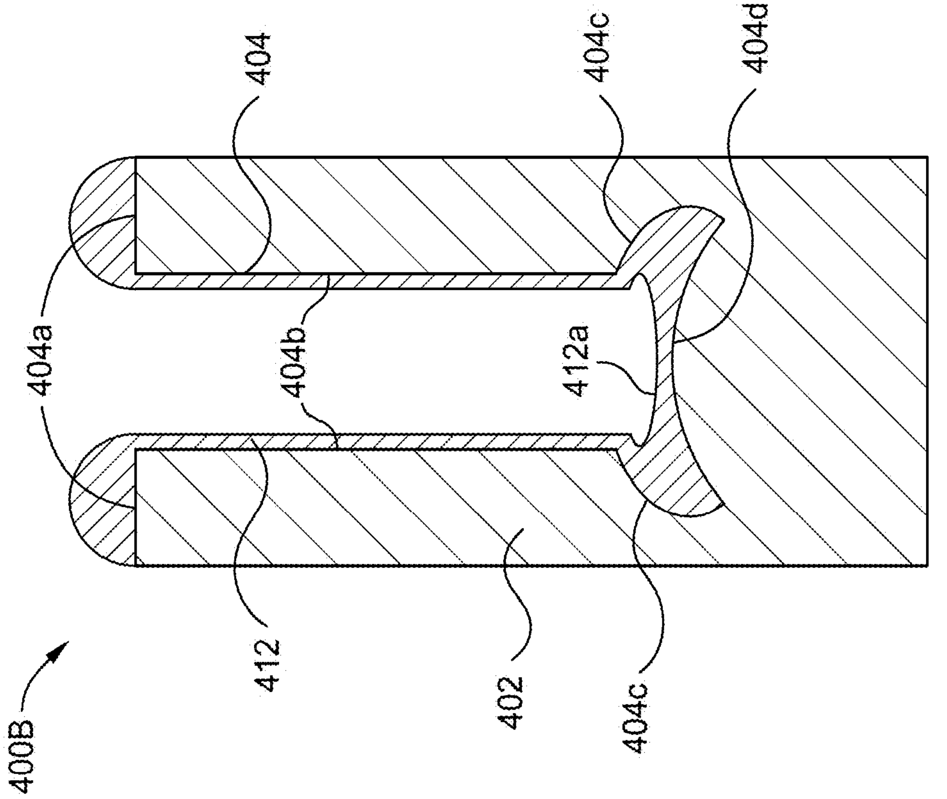
FIGS. 4A-4B illustrate a side cross sectional view of a substrate according one or more embodiments.
Figure 4A:
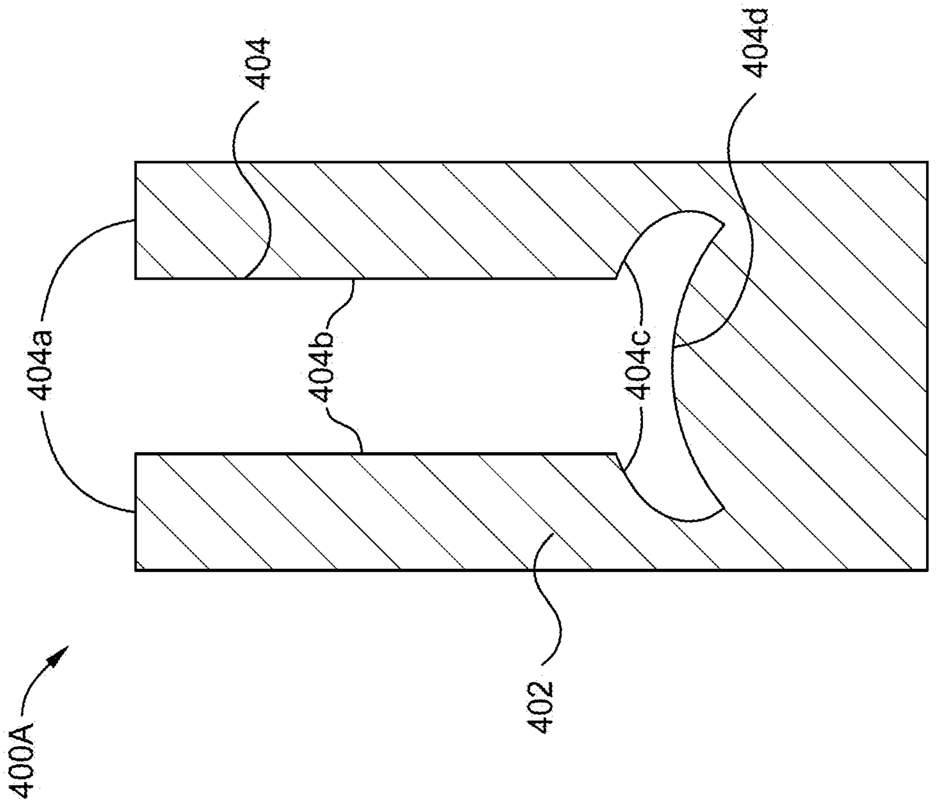

FIGS. 4A-4B illustrate cross-sectional views of a substrate having a film deposited thereon at different stages of a deposition process 300 illustrated in the flow diagram FIG. 3. The following description refers simultaneously to both the deposition process 300 and the cross-sectional views of FIGS. 4A-4B. In various embodiments, the deposition process 300 is implemented via instructions stored in the memory of a controller (e.g., controller 194 of FIG. 1), which, when executed by the controller (e.g., including a CPU or ASIC), performs the deposition process 300 to form a film 412 on a substrate surface 404, such as in trenches 400A, 400B illustrated in FIGS. 4A-4B.

With reference to FIG. 3, one or more embodiments are directed to the deposition process 300 of depositing a film. In some embodiments, the deposition process 300 includes a pre-treatment operation 302. The pre-treatment can include any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In some embodiments, during deposition process 300, the gas distributor 235 is maintained at 175° C., while the substrate support 215 is maintained at 450° C.

At deposition 310, which includes operations 304, 306, and 308, a process cycle is performed to deposit film 412 on the surface 404 of the substrate 402, wherein the substrate 402 is disposed on substrate support 215 (not shown). In some embodiments, the surface 404 of the substrate 402 includes the trench fin top 404*a*, trench sidewalls 404*b*, trench undercut 404*c*, and trench bottom 404*d*. The deposition process can include one or more operations to form the film 412 on surface 404 of the substrate 402. The substrate 402 can be any suitable substrate material. In one or more embodiments, the substrate 402 comprises a dielectric material, such as amorphous-silicon nitride (SiN), silicon oxide (SiO), silicon carbide (SiC), $SiO_xC_y$, $SiC_xO_yN_z$, silicon boron (SiB), silicon germanium (SiGe). In one or more embodiments, substrate 402 comprises one or more of silicon (Si), germanium (Ge), carbon (C), oxygen (O), nitrogen (N), boron (B), and hydrogen (H). In one or more embodiments, substrate 402 comprises, by mass, about 40%+/−5% silicon (Si), 50%+/−5% nitrogen (N), and 10%+/−5% hydrogen (H). Although several examples of materials from which the substrate 402 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

At operation 304, precursor gases (e.g. $SiH_4$ and/or $H_2$) are introduced into a processing chamber. At operation 306, a dual RF frequency power source 202 of FIG. 2 is used to generate a plasma in the processing chamber. The dual RF frequency power source 202 includes the first RF power source 202*a* and a second RF power source 202*b*. The first RF power source 202*a* has a first frequency of about 13 MHz to about 80 MHz, such as about 13.56 MHz to about 40 MHz, such as about 13.56 MHz to about 27 MHz, such as 27 MHz. The second RF power source 202*b* has a second frequency of about 350 kHz to about 2 MHz, such as 350 kHz. The dual RF power source 202 is synchronously pulsed at a duty cycle range between about 10% to about 90%, such as at a 50% duty cycle, and a pulsing frequency range between about 1 kHz to about 10000 kHz, such as 1 kHz pulsing frequency, whereby the first RF power source 202*a* at a first frequency is pulsed at the same time as the second RF power source 202*b* at a second frequency. In some embodiments, the dual RF frequency power source 202 provides power simultaneously and continuously during deposition 310.

By modulating the ion-to-radical ratio, ion energy distribution, and/or ion angular distribution during the deposition process, the bottom profile of trenches can be tuned and controlled. Modulation of said ion-to-radical ratio, ion energy distribution, and/or ion angular distribution is in part accomplished by generating a low frequency radiofrequency (RF) plasma which increases the ion energy. Accordingly, having one of the frequencies of the dual RF frequency power source set to a low frequency RF power increases the ion energy, which narrows the ion angular distribution function. This, in turn, increases the etch rate and sputter rate of the trench bottom 404*d* while preserving the trench undercut 404*c*, which are features that are typically not within line-of-sight. The increased etch and sputter rate of the trench bottom 404*d* while preserving the trench undercut 404*c* allows for a flatter bottom profile, or even, a concave bottom profile. Synchronous (i.e., simultaneous) pulsing of the dual RF frequency power source 202 (e.g., the first and second RF power sources 202*a*, 202*b*) allows for greater radical contribution during the deposition process during plasma off times. Thus, tuning pulsing parameters, such as the RF frequency plasma, pulsing frequency, synchronicity of pulsing, and duty cycle, allows for the toggling of ion versus radical contribution to the deposition process. Further, tuning pulsing parameters increases the deposition rate in non-line-of-sight features, such as trench undercut 404*c* and trench bottom 404*d*, and enables the shape (e.g., of the trench bottom 404*d*) to be changed, for example, from a convex shape (as depicted in FIG. 4A) to a concave shape 412*a* (as depicted in FIG. 4B).

At operation 308, a film 412 of suitable dielectric material, such as amorphous-silicon, is deposited on the surface 404, including the trench fin top 404*a*, trench sidewalls 404*b*, trench undercut 404*c*, and trench bottom 404*d* of the substrate 402 using the dual RF frequency power source 202. Per cycle of deposition 310, a film having a thickness of at least 10 Å, such as about 10 Å to about 1 nanometer (nm), such as between about 10 Å to about 20 Å, is deposited on the surface 404 of the substrate 402 disposed on the substrate support 215.

At operation 312, the film 412 deposited on the trench fin top 404*a* and trench sidewall 404*b* is etched. Etching gases are introduced into the processing volume 260. In some embodiments, the precursor gases introduced into the processing volume 260 at operation 304 are purged from the processing chamber before the additional etching gases are introduced. Etching gases include any suitable gas that can be used to etch the film 412, such as $H_2$, Ar, or a combination thereof. Etching gases are flowed into the processing volume 260 at a flow rate of between about 500 sccm to about 3000 sccm. Film 412 is then etched using a 27 MHz continuous wave plasma of the etching gas generated by dual RF frequency power source 202.

At operation 314, nitrogen gas ($N_2$) is introduced into the processing volume 260 at a flow rate of between 1000 sccm to about 5000 sccm. In some embodiments, the precursor gases introduced into the processing volume 260 at operation 304 and the additional etching gases introduced at operation 308 are purged from the processing chamber before operation 314. Film 412 is then nitridized using a nitrogen 27 MHz continuous wave plasma generated by dual RF frequency power source 202. At operation 316, a determination is made regarding whether a predetermined thickness of the deposited film or a predetermined number of process cycles has been achieved. If the deposited film has reached a predetermined thickness or a predetermined number of process cycles have been performed, the deposition process 300 moves to an optional post-processing operation 318. In one or more embodiments, the predetermined thickness of the deposited film is between about 6 nm to about 20 nm, such as about 6 nm to about 10 nm. In one or more embodiments, the predetermined number of process cycles is between about 6 cycles to about 20 cycles. In one or more embodiments, trench 400B has a wet etch rate between about 1 Å/minute to about 3 Å/minute, such as 2 Å/minute in a 500:1 dilute hydrofluoric acid (DHF) bath. In one or more embodiments, trench 400B has a current leakage between about $1\times10^{-7}$ amps to about $1\times10^{-5}$ amps, such as $1\times10^{-6}$ amps at 2 megavolts per centimeter (MV/cm). If the thickness of the film 412 or the number of process cycles has not been reached the predetermined threshold, the deposition process 300 returns to operation 310, where operations 304, 306, and 308 are again performed.

In one embodiment, a method of forming a layer, including positioning a substrate in a processing chamber; introducing at least one precursor gas into the processing chamber; generating a dual RF plasma with the at least one precursor gas by pulsing a first RF power source and a second RF power source, the first RF power source and the second RF power source having different frequencies; depositing a layer on the substrate with the dual RF plasma; introducing at least one additional precursor gas into the processing chamber; generating an etching plasma by applying the first RF power source to the at least one additional precursor gas; and etching the layer with the etching plasma. The at least one precursor gas is a hydrogen containing gas, a silicon containing gas, a nitrogen containing gas, Argon, or a combination therein. The first RF power source has a first frequency when generating the dual RF plasma and when generating the etching plasma. The first RF power source and the second RF power source are electrically connected to a gas distributor, and pulsing the first RF power source and the second RF power source comprises synchronously pulsing the first RF power source and the second RF power source. Pulsing the first RF power source and the second RF power source is performed at a duty cycle between 10% to 90%, and a pulsing frequency between 1 kHz to 10000 kHz. The frequency of the first RF power source is between 13 MHz to 27 MHz. The frequency of the second RF power source is between 350 kHz to 2 MHz. Further comprising applying the first RF power source to the at least one additional precursor gas to generate a nitridizing plasma to nitridize the layer. The at least one additional precursor gas comprises a hydrogen containing gas and argon. A deposition cycle comprises introducing the at least one precursor gas, generating the dual RF plasma, depositing the layer on the substrate, introducing the at least one additional precursor gas, generating the etching plasma, and etching the layer, and wherein the deposition cycle is performed for a plurality of deposition cycles, and each deposition cycle included in the plurality of deposition cycles deposits a layer having a thickness between 10 Å and 20 Å on the substrate. A bottom profile of a feature extending a feature depth from a surface of the substrate has a first shape, and depositing the layer on the substrate changes the bottom profile of the feature from the first shape to a concave shape. The layer is a dielectric film containing silicon selected from one or more of amorphous silicon, SiO, SiC, SiOC, SiN, and/or SiCON. A current leakage of the layer is between $1\times10^{-7}$ amps at 2 MV/cm to $1\times10^{-5}$ amps at 2 MV/cm.

In another embodiment, a substrate processing method, including forming a layer containing silicon on a substrate surface, the substrate surface having at least one feature thereon, the at least one feature extending a feature depth from the substrate surface to a bottom surface, the bottom surface having a convex shape, the at least one feature having a width defined by a first sidewall and a second sidewall, where the layer containing silicon is deposited on the substrate surface, the first sidewall, the second sidewall, and the bottom surface of the at least one feature by generating a dual radiofrequency (RF) plasma, wherein generating the dual RF plasma comprises synchronously pulsing a first RF power source and a second RF power source, the first RF power source and the second RF power source being electrically connected to a gas distributor. The layer containing silicon comprises by mass 35% to 45% silicon. The layer containing silicon further comprises by mass 45% to 55% nitrogen and 5% to 15% hydrogen. Etching the layer containing silicon at a wet etch rate of between 1 Å/minute to 3 Å/minute in a 500:1 dilute hydrofluoric acid (DHF) bath. Depositing the layer containing silicon comprises generating a dual RF plasma by synchronously pulsing a first RF power source and a second RF power source, the first RF power source and the second RF power source having different frequencies. The frequency of the first RF power source is between 13 MHz to 27 MHz and the frequency of the second RF power source is between 350 kHZ to 2 MHz.

In yet another embodiment, a non-transitory computer readable medium including instructions, that, when executed by a controller of a processing chamber, cause the processing chamber to perform operations, includes positioning a substrate in a processing chamber; introducing the at least one precursor gas into the processing chamber; generating the dual RF plasma with the at least one precursor gas by pulsing the first RF power source and the second RF power source, the first RF power source and the second RF power source having different frequencies and being electrically connected to a gas distributor; depositing the layer on the substrate with the dual RF plasma; introducing the at least one additional precursor gas into the processing chamber; generating the etching plasma by applying the first RF power source to the at least one additional precursor gas; and etching the layer with the etching plasma.

A variety of multi-processing platforms, including the Centura®, Dual ACP, Producer® GT, Precision®, and Endura® platform, available from Applied Materials® as well as other processing systems may be utilized.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Embodiments of the present disclosure generally relate to substrates for electronic devices and to methods of forming substrates. Substrates described herein can have superior device performance relative to conventional technologies. Methods described herein are reproducible and can yield uniform passivation layers. Further, embodiments described herein can enable, for example, streamlined material handling and integration and longer shelf life for the passivated substrates (passivated film rolls) than conventional technologies.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, process operation, process operations, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, process operation, process operations, element, or elements and vice versa, such as the terms "comprising," "consisting essentially of," "consisting of" also include the product of the combinations of elements listed after the term.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. For example, the recitation of the numerical range 1 to 5 includes the subranges 1 to 4, 1.5 to 4.5, 1 to 2, among other subranges. As another example, the recitation of the numerical ranges 1 to 5, such as 2 to 4, includes the subranges 1 to 4 and 2 to 5, among other subranges. Additionally, within a range includes every point or individual value between its end points even though not explicitly recited. For example, the recitation of the numerical range 1 to 5 includes the numbers 1, 1.5, 2, 2.75, 3, 3.80, 4, 5, among other numbers. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise. For example, aspects comprising "a layer" includes aspects comprising one, two, or more layers, unless specified to the contrary or the context clearly indicates only one layer is included.

While the foregoing is directed to aspects of the present disclosure, other and further aspects of the disclosure may be devised without departing from the basic scope thereof, and the scope thereof is determined by the claims that follow.

What is claimed is:

1. A method of forming a layer, comprising:

positioning a substrate in a processing chamber, the substrate having a surface and a feature extending a depth into the surface;

introducing at least one precursor gas into the processing chamber;

generating a dual radiofrequency (RF) plasma with the at least one precursor gas by pulsing a first RF power source and a second RF power source, the first RF power source and the second RF power source having different frequencies;

depositing a layer on the substrate with the dual RF plasma to change a bottom profile of the feature from a first shape to a concave shape;

introducing at least one additional precursor gas into the processing chamber;

generating an etching plasma by applying the first RF power source to the at least one additional precursor gas; and etching the layer with the etching plasma.

2. The method of claim 1, wherein the at least one precursor gas is a hydrogen containing gas, a silicon containing gas, a nitrogen containing gas, argon, or a combination thereof.

3. The method of claim 1, wherein the first RF power source has a first frequency when generating the dual RF plasma and when generating the etching plasma.

4. The method of claim 1, wherein the first RF power source and the second RF power source are electrically connected to a gas distributor; and pulsing the first RF power source and the second RF power source comprises synchronously pulsing the first RF power source and the second RF power source.

5. The method of claim 1, wherein pulsing the first RF power source and the second RF power source is performed at a duty cycle between 10% to 90%, and a pulsing frequency between 1 kHz to 10000 kHz.

6. The method of claim 1, wherein a frequency of the first RF power source is between 13 MHz to 27 MHz.

7. The method of claim 1, wherein a frequency of the second RF power source is between 350 kHz to 2 MHz.

8. The method of claim 1, further comprising applying the first RF power source to the at least one additional precursor gas to generate a nitridizing plasma to nitridize the layer.

9. The method of claim 1, wherein the at least one additional precursor gas comprises a hydrogen containing gas and argon.

10. The method of claim 1, wherein a deposition cycle comprises introducing the at least one precursor gas, generating the dual RF plasma, depositing the layer on the substrate, introducing the at least one additional precursor gas, generating the etching plasma, and etching the layer, and wherein the deposition cycle is performed for a plurality of deposition cycles, and each deposition cycle included in the plurality of deposition cycles deposits a layer having a thickness between 10 Å and 20 Å on the substrate.

11. The method of claim 1, wherein the layer is a dielectric film containing silicon selected from one or more of amorphous silicon, SiO, SiC, SiOC, SiN, and/or SiCON.

12. The method of claim 1, wherein a current leakage of the layer is between 1×10−7 amps at 2 MV/cm to 1×10−5 amps at 2 MV/cm.

13. A substrate processing method, comprising:

forming a layer containing silicon on a substrate surface, the substrate surface having at least one feature thereon, the at least one feature extending a feature depth from the substrate surface to a bottom surface, the bottom surface having a convex shape, the at least one feature having a width defined by a first sidewall and a second sidewall, where the layer containing silicon is deposited on the substrate surface, the first sidewall, the second sidewall, and the bottom surface of the at least one feature by generating a dual radiofrequency (RF) plasma, wherein generating the dual RF plasma comprises pulsing a first RF power source and a second RF power source, the first RF power source and the second RF power source being electrically connected to a gas distributor.

14. The substrate processing method of claim 13, the layer containing silicon comprises by mass 35% to 45% silicon.

15. The substrate processing method of claim 14, the layer containing silicon further comprises by mass 45% to 55% nitrogen and 5% to 15% hydrogen.

16. The substrate processing method of claim 13, further comprising etching the layer containing silicon at a wet etch rate between 1 Å/minute to 3 Å/minute in a 500:1 dilute hydrofluoric acid (DHF) bath.

17. The substrate processing method of claim 13, wherein the first RF power source and the second RF power source have different frequencies.

18. The substrate processing method of claim 17, wherein a frequency of the first RF power source is between 13 MHz to 27 MHz and a frequency of the second RF power source is between 350 KHZ to 2 MHz.

19. A non-transitory computer readable medium including instructions, that, when executed by a controller of a processing chamber, cause the processing chamber to perform operations comprising:

positioning a substrate in a processing chamber, the substrate having a surface and a feature extending a depth into the surface;

introducing at least one precursor gas into the processing chamber;

generating a dual radiofrequency (RF) plasma with the at least one precursor gas by pulsing a first RF power source and a second RF power source, the first RF power source and the second RF power source having different frequencies and being electrically connected to a gas distributor;

depositing a layer on the substrate with the dual RF plasma to change a bottom profile of the feature from a first shape to a concave shape;

introducing at least one additional precursor gas into the processing chamber;

generating an etching plasma by applying the first RF power source to the at least one additional precursor gas; and etching the layer with the etching plasma.

* * * * *